US012812798B2

(12) United States Patent
Nordby et al.

(10) Patent No.: US 12,812,798 B2
(45) Date of Patent: Nov. 24, 2026

(54) CAPTIVE OBJECT FLEXURE MECHANISM

(71) Applicant: reMarkable AS, Oslo (NO)

(72) Inventors: Gaute Wiig Nordby, Oslo (NO); Xian Dong Guo, Pudong (CN); Peng Shuai, Shenzhen (CN)

(73) Assignee: reMarkable AS, Oslo (NO)

(*) Notice: Subject to any disclaimer, the term of this patent is extended or adjusted under 35 U.S.C. 154(b) by 56 days.

(21) Appl. No.: 18/779,170

(22) Filed: Jul. 22, 2024

(65) Prior Publication Data

US 2026/0013054 A1 Jan. 8, 2026

(30) Foreign Application Priority Data

Jul. 8, 2024 (CN) ......................... 202410914174.2

(51) Int. Cl.
*B65D 25/10* (2006.01)
*G06F 3/0354* (2013.01)
(Continued)

(52) U.S. Cl.
CPC ....... *H05K 5/0214* (2022.08); *G06F 3/03545* (2013.01); *H05K 5/0091* (2013.01)

(58) Field of Classification Search
CPC ...... B65D 25/101; B65D 25/10; B65D 71/70; B65D 85/42; B65D 25/108; B65D 73/005;
(Continued)

(56) References Cited

U.S. PATENT DOCUMENTS 3,365,761 A 1/1968 Kalvig
4,711,353 A 12/1987 Rozmestor
(Continued)

FOREIGN PATENT DOCUMENTS

CN 104142705 A 11/2014
CN 116257145 A 3/2023
(Continued)

OTHER PUBLICATIONS

English Translation of WO2020/130516 (Year: 2018).*
(Continued)

*Primary Examiner* — Steven A. Reynolds
(74) *Attorney, Agent, or Firm* — AWA Sweden AB; Thomas L. Ewing

(57) ABSTRACT

Embodiments of the invention provide a container (e.g., marker tip holder box) that comprises a holding pad (e.g., marker tip holder pad) having a plurality of holders to retain objects (e.g., marker tips for use with a pen-stylus). Each holder has an opening to receive an object (e.g., a marker tip). Each holder further comprises a flexible leaflet, that surrounds the opening in the holder, wherein the flexible leaflet has an irregular but nearly conical shape that narrows in diameter as it approaches an arrester that is located below the flexible leaflet, such that a retained object rests in the arrester in the holder. The flexible leaflet has two states, a first state that holds the retained object (e.g., a marker tip) with sufficient firmness to retain the object in the holder, and a second state in which the irregular but nearly conical shape of the flexible leaflet interferes with an outer housing of the object retained in the holder to form a flexure that enables removal of the retained object from the container.

11 Claims, 7 Drawing Sheets

(51) Int. Cl.
*H05K 5/00* (2006.01)
*H05K 5/02* (2006.01)

(58) Field of Classification Search
CPC .. B65D 73/0014; B65D 83/10; H05K 5/0214; H05K 5/0091
USPC ................ 206/478, 480, 483, 477, 488, 486
See application file for complete search history.

(56) References Cited

U.S. PATENT DOCUMENTS 6,064,765 A 5/2000 Hirayama
6,151,206 A 11/2000 Kato et al.
7,145,092 B2 12/2006 Tuhkala
7,239,505 B2 7/2007 Keely et al.
7,461,444 B2 12/2008 Deaett et al.
7,722,358 B2 5/2010 Chatterjee et al.
7,941,191 B2 5/2011 Hanssen et al.
D645,465 S 9/2011 Lin
8,022,307 B2 9/2011 Chu et al.
8,143,983 B1 3/2012 Lauder et al.
D671,114 S 11/2012 Akana
8,498,100 B1 7/2013 Whitt et al.
D689,482 S 9/2013 Akana
D692,886 S 11/2013 Bates
8,638,320 B2 1/2014 Harley
D701,205 S 3/2014 Akana
D702,229 S 4/2014 Lim
8,688,037 B2 4/2014 Chatterjee et al.
D704,702 S 5/2014 Akana
D705,775 S 5/2014 Canizares
8,724,302 B2 5/2014 Whitt et al.
8,780,541 B2 7/2014 Whitt et al.
D711,371 S 8/2014 Chen
8,817,457 B1 8/2014 Colby et al.
8,873,227 B2 10/2014 Whitt et al.
8,947,864 B2 2/2015 Whitt et al.
8,947,868 B2 2/2015 Motoishi et al.
8,964,379 B2 2/2015 Rihn
9,017,092 B1 4/2015 McCracken
9,146,620 B2 9/2015 Whitt et al.
9,149,100 B2 10/2015 Marshall
9,213,424 B1 12/2015 Dunn
9,218,025 B2 12/2015 Bates
9,239,639 B1 1/2016 Vanderet
9,244,535 B2 1/2016 Bates
D750,621 S 3/2016 Loor Canizares
9,280,181 B2 3/2016 Tomita et al.
9,335,793 B2 5/2016 Rothkopf
9,390,869 B2 7/2016 Lee
9,436,229 B2 9/2016 Yoo
9,442,518 B2 9/2016 Siddiqui
9,443,673 B2 9/2016 Chu
9,451,822 B2 9/2016 Gu
9,494,976 B2 11/2016 Bates
9,494,977 B2 11/2016 Spollen
9,496,102 B2 11/2016 Bates
D773,454 S 12/2016 Akana
D776,116 S 1/2017 Akana
9,532,631 B2 1/2017 Gu
9,552,014 B2 1/2017 Tomita
D779,485 S 2/2017 Akana
9,575,515 B2 2/2017 Leon
9,588,551 B1 3/2017 Hegde
9,607,491 B1 3/2017 Mortimer
9,621,214 B2 4/2017 Paek
9,632,602 B2 4/2017 Marwah
D786,238 S 5/2017 Roberts
9,678,542 B2 6/2017 Whitt et al.
D792,393 S 7/2017 Akana
9,705,242 B1 7/2017 Heiskanen
9,705,243 B1 7/2017 McCracken
9,715,251 B2 7/2017 Chung
D795,249 S 8/2017 Wall
9,720,453 B2 8/2017 Nelson
9,728,915 B2 8/2017 Aldehayyat
9,760,183 B2 9/2017 Kawaguchi
9,762,279 B2 9/2017 Lee
9,769,293 B2 9/2017 Gu
D801,330 S 10/2017 Morgan
9,778,705 B2 10/2017 Esmaeili
9,785,193 B2 10/2017 Sano
9,823,093 B2 11/2017 Kauhaniemi
D804,470 S 12/2017 Hallar
9,840,861 B1 12/2017 Määttä
9,851,759 B2 12/2017 Tazbaz
D807,348 S 1/2018 Wang
9,883,583 B2 1/2018 Cousins
D810,075 S 2/2018 Liu
D810,745 S 2/2018 Luo
9,893,452 B2 2/2018 Wagman
9,904,327 B2 2/2018 Whitt et al.
9,904,373 B2 2/2018 Shirata
9,904,379 B2 2/2018 Marshall
9,930,773 B2 3/2018 Holbery
9,946,295 B2 4/2018 Smith
9,946,296 B2 4/2018 Smith
9,952,623 B2 4/2018 Tomita
9,965,000 B2 5/2018 Koppal
9,977,460 B2 5/2018 Wagman
D820,838 S 6/2018 Akana
D820,839 S 6/2018 Akana
D820,840 S 6/2018 Akana
D820,841 S 6/2018 Akana
9,997,305 B2 6/2018 Wang
9,997,308 B2 6/2018 Leong
9,998,166 B2 6/2018 Kim
10,013,030 B2 7/2018 Whitt et al.
10,050,368 B2 8/2018 Wagman
10,056,205 B2 8/2018 Hegde
10,061,359 B2 8/2018 Määttä
10,082,840 B2 9/2018 Esmaeili
10,082,913 B2 9/2018 Moller
10,090,121 B2 10/2018 Winter
D832,836 S 11/2018 Akana
D835,097 S 12/2018 Morgan
10,153,577 B2 12/2018 Wagman
D839,266 S 1/2019 Chang
10,175,782 B2 1/2019 Katsuhara
D842,852 S 3/2019 Kim
10,257,950 B2 4/2019 Määttä
10,289,210 B1 5/2019 Wang
10,303,209 B2 5/2019 Smith
10,303,215 B2 5/2019 Corbin
10,317,953 B2 6/2019 Esmaeili
D852,794 S 7/2019 Huebner
10,345,916 B2 7/2019 Gu
10,353,485 B1 7/2019 Zhang
10,362,670 B2 7/2019 Cousins
D856,322 S 8/2019 Huebner
10,372,159 B2 8/2019 Kim
10,418,741 B2 9/2019 Wagman
D867,452 S 11/2019 Morris
10,466,804 B2 11/2019 Murphy
10,468,211 B2 11/2019 Leong
10,474,199 B2 11/2019 Longo
10,481,746 B2 11/2019 Moller
10,483,688 B2 11/2019 Wrisley
10,520,127 B2 12/2019 Dearsley
10,551,878 B2 2/2020 Longo
10,566,151 B1 2/2020 Wang
10,579,097 B2 3/2020 Wagman
10,590,600 B1 3/2020 Wang
10,635,186 B1 4/2020 Wang
10,672,548 B2 6/2020 Srinivasan
10,683,591 B1 6/2020 Podhajny
10,725,544 B1 7/2020 Taylor
10,732,728 B1 8/2020 Sunshine
10,739,825 B2 8/2020 Gilbert
10,754,393 B2 8/2020 Campbell
D901,486 S 11/2020 Moon
10,890,954 B2 1/2021 Evans
10,908,652 B2 2/2021 Määttä
10,919,043 B2 * 2/2021 Johns ........................ B01L 9/06

(56) References Cited

U.S. PATENT DOCUMENTS

| | | | | |
|---|---|---|---|---|
| 10,921,863 | B2 | 2/2021 | Gault | |
| 10,923,261 | B2 | 2/2021 | Singla | |
| 10,936,020 | B2 | 3/2021 | Chang | |
| 10,948,999 | B2 | 3/2021 | Hewett | |
| 10,955,943 | B1 | 3/2021 | Large | |
| 11,023,016 | B2 | 6/2021 | Kim | |
| 11,048,304 | B2 | 6/2021 | Kang | |
| 11,048,337 | B2 | 6/2021 | Fukumoto | |
| 11,061,442 | B2 | 7/2021 | Gault | |
| 11,062,831 | B2 | 7/2021 | Määttä | |
| 11,066,861 | B2 | 7/2021 | Zhu | |
| 11,073,871 | B2 | 7/2021 | Jung et al. | |
| D928,145 | S | 8/2021 | Solberg | |
| D928,146 | S | 8/2021 | Solberg | |
| 11,086,975 | B2 | 8/2021 | Huang et al. | |
| 11,091,855 | B2 | 8/2021 | Holbery | |
| 11,095,071 | B2 | 8/2021 | Lee | |
| 11,119,535 | B2 | 9/2021 | Haworth | |
| 11,211,212 | B2 | 12/2021 | Huang | |
| 11,745,186 | B2 * | 9/2023 | Dunbar | G01N 35/04 422/562 |
| 2002/0108917 | A1 * | 8/2002 | Maruyama | B01L 9/50 211/74 |
| 2003/0034960 | A1 | 2/2003 | Li | |
| 2011/0147398 | A1 | 6/2011 | Ahee | |
| 2011/0238055 | A1 | 9/2011 | Kim | |
| 2012/0327042 | A1 | 12/2012 | Harley | |
| 2014/0006296 | A1 | 1/2014 | Hughes et al. | |
| 2014/0027332 | A1 * | 1/2014 | Pawlowski | A61M 5/008 248/346.03 |
| 2014/0043242 | A1 | 2/2014 | Dietz | |
| 2014/0211393 | A1 | 7/2014 | Lee | |
| 2015/0029161 | A1 | 1/2015 | Koo | |
| 2015/0239278 | A1 * | 8/2015 | White | B43K 23/001 211/69.5 |
| 2015/0268742 | A1 | 9/2015 | Park | |
| 2016/0044422 | A1 | 2/2016 | Aurongzeb | |
| 2016/0188013 | A1 | 6/2016 | Yoneoka | |
| 2016/0195942 | A1 | 7/2016 | Chen | |
| 2016/0364027 | A1 | 12/2016 | Bernstein | |
| 2016/0368133 | A1 * | 12/2016 | Welfel | B25H 3/06 |
| 2017/0038842 | A1 | 2/2017 | Yairi | |
| 2017/0068342 | A1 | 3/2017 | Zimmerman | |
| 2017/0108953 | A1 | 4/2017 | Mao | |
| 2017/0285774 | A1 | 10/2017 | Parikh | |
| 2018/0052534 | A1 | 2/2018 | Ron | |
| 2018/0329526 | A1 | 11/2018 | Peretz | |
| 2018/0348898 | A1 | 12/2018 | Kato | |
| 2019/0369755 | A1 | 12/2019 | Roper | |
| 2020/0033986 | A1 | 1/2020 | Kämpf | |
| 2020/0401241 | A1 | 12/2020 | Barel | |
| 2021/0031235 | A1 | 2/2021 | Neuwirth | |
| 2021/0103346 | A1 | 4/2021 | Hoshino | |
| 2021/0247845 | A1 | 8/2021 | Kügerl | |
| 2021/0247858 | A1 | 8/2021 | Hashimoto | |
| 2021/0255716 | A1 | 8/2021 | Jin | |
| 2021/0311603 | A1 | 10/2021 | Baki | |
| 2021/0382569 | A1 | 12/2021 | Kamiyama | |
| 2022/0033600 | A1 | 2/2022 | Hoshino | |
| 2022/0258525 | A1 | 8/2022 | Callahan | |
| 2022/0334661 | A1 | 10/2022 | Barel | |
| 2022/0397968 | A1 | 12/2022 | Lien | |
| 2022/0413639 | A1 | 12/2022 | Watanabe | |
| 2023/0045649 | A1 | 2/2023 | Chen | |
| 2023/0077162 | A1 | 3/2023 | Sakamoto | |
| 2023/0108860 | A1 | 4/2023 | Hashimoto | |
| 2023/0234392 | A1 | 7/2023 | Duffy | |
| 2023/0259221 | A1 | 8/2023 | Fu | |
| 2024/0019945 | A1 | 1/2024 | Horie | |
| 2024/0094834 | A1 | 3/2024 | Lee | |
| 2024/0160317 | A1 | 5/2024 | Jang | |
| 2024/0329758 | A1 | 10/2024 | Chou | |
| 2024/0411387 | A1 | 12/2024 | Kato | |

FOREIGN PATENT DOCUMENTS

| | | | |
|---|---|---|---|
| DE | 202013101011 | U1 | 5/2013 |
| WO | 2001031457 | A1 | 5/2001 |
| WO | 2016/154740 | A1 | 10/2016 |
| WO | 2020/130516 | A2 | 6/2020 |
| WO | 2020/130516 | A3 | 6/2020 |
| WO | 2021194484 | A1 | 9/2021 |

OTHER PUBLICATIONS

A publication regarding the Aspire Switch 10 ("Acer") published on Aug. 1, 2014.

PCT International Search Report and Written Opinion, PCT Application No. PCT/IB2022/000703, Jun. 2, 2023, 19 pages.

Extended European Search Report, EP application 25173308.5, issued by the European Patent Office.

Extended European Search Report, EP application 25173333.3, issued by the European Patent Office.

Extended European Search Report, EP application 25173357.2, issued by the European Patent Office.

Extended European Search Report for EP 25173373.9, issued Sep. 12, 2025.

HW AF63 (MP 2018), schematic, released in 2018 and related product advertisement.

HP Zenvo (MP 2021) schematic, released in 2021 and related product advertisement.

Dell Hellcat (MP 2021) schematic, released in 2021 and related product advertisement.

Extended European Search Report, EP application 25173422.4 issued by the European Patent Office.

* cited by examiner

CAPTIVE OBJECT FLEXURE MECHANISM

CROSS-REFERENCE TO RELATED APPLICATIONS

The present application, U.S. patent application Ser. No. 18/779,170 entitled "Captive Object Flexure Mechanism," is related to U.S. patent application Ser. No. 18/779,151, entitled "Replaceable Conductive Marker Tip", filed Jul. 22, 2024; U.S. patent application Ser. No. 18/779,154, entitled "Advanced Paper Emulation," filed Jul. 22, 2024; U.S. patent application Ser. No. 18/779,158 entitled "Marker Protection System," filed Jul. 22, 2024; U.S. patent application Ser. No. 18/779,164 entitled "Marker Writing System," filed Jul. 22, 2024; and U.S. patent application Ser. No. 18/779,149, entitled "Active Pen-Stylus Precise Eraser" filed Jul. 22, 2024, all of which are owned by the Applicant of the present application. These related applications are incorporated herein by reference in their entirety.

TECHNICAL FIELD

The disclosure relates generally to a container adapted to retain and hold objects for storage and transportation. In particular, embodiments of the present invention relate to a container for safely holding replaceable marker tips for an active pen-stylus so that the replaceable marker tips may be easily attached to an active pen-stylus.

BACKGROUND

Containers are often needed to retain and hold goods of various types, sizes, and sensitivities, for storage and transportation. In particular, it may often be helpful to retain goods in such a manner that they can be readily employed by end user consumers. Many forms of containers have been developed over thousands of years to hold various goods for both storage and transportation. While undoubtedly useful, these containers may not be ideally adapted for all use cases.

A "pen-stylus" (or "pen" or "stylus") is typically a pen- or pencil-shaped instrument whose position (e.g., tip position) on a computer monitor can be detected either electronically or physically. The pen-stylus enables users to perform tasks, such as drawing or making selections on a computing device. While devices with touchscreens, such as some computers, mobile devices (smartphones and personal digital assistants), game consoles, and graphics tablets, can often be operated with a fingertip, a pen-stylus typically provides more accurate and controllable input. In essence, a pen-stylus has a similar function as a mouse or touchpad as a pointing device but may enable much more precise inputs for certain drawing tasks. The use of a pen-stylus is sometimes termed "pen-stylus computing."

Conventional pen-styluses have typically been constructed to detect "pen-down" information in addition to coordinate information on the pointing device. Such pen-down information typically arises when the pen-stylus point is in contact with a panel of the digitizer. The pen-down information is conventionally detected by either force (e.g., pressure) sensitive means for detecting the vertical force applied to the pen-stylus point and/or detected by an electrical connection between the pen-stylus and the panel of the digitizer. The position data may be smoothed and/or de-noised before it is used to estimate the velocity and/or the acceleration of the input object. Such smoothing and/or de-noising may be done using an appropriate technique—for example, by applying a recursive Bayesian filter or smoothing, such as a Kalman filter, to the position data.

Active pen-styluses (also known as "active pen" or "digital styluses") include digital components and/or circuitry inside the pen-stylus that communicates with a digitizer on the touch device. This communication allows for advanced features such as force (e.g., pressure) sensitivity, tilt detection, programmable buttons, palm detection; eraser tips, memorizing settings, and writing data transmission.

Active pen-styluses typically employ different protocols from different manufacturers in order to communicate with the digitizer of a graphic tablet or multi-touch device. For an active pen-stylus to function properly, its digital component protocol must typically match the digitizer technology in the touch screen with which it interacts. Thus, the digital protocol of the pen-stylus must be compatible with the device digitizer, otherwise input from the pen-stylus will not register on the device. Active pen-styluses are typically powered by a removable or chargeable battery.

A pen-stylus' performance is often measured by four characteristics: 1) comfort, 2) resistance, 3) balance and overall weight, and 4) precision. "Precision" can sometimes be a nebulous characteristic, so it is often described in terms of further characteristics, such as: 1) responsiveness and speed, 2) jitter, 3) tilt, 4) levels of force (e.g., pressure), and 5) palm rejection or detection. This last element of precision may prevent a touch device from registering or marking the screen when a hand or palm is resting on the screen surface. Effective operation may rely on a combination of technology in the pen-stylus, the operating system software and the screen digitizer technology for effective operation.

In order for pen-styluses to achieve improved performance, designers have determined that in the tradeoff between improved performance and longevity that it may be necessary to allow some parts of the pen-stylus to wear. As such, these wearable parts may eventually need to be replaced. The parts should preferably be easily replaceable by users and without a necessity for employing specialized tools. In addition, the wearable parts should also preferably be easily and quickly replaced by users to minimize their downtime and productivity. As mentioned above, the world has seen great strides in container technology over many thousands of years, however, further improvements are still warranted. Moreover, specific use cases for pen-styluses may compel levels of precision and additional functionality not available in conventional devices.

SUMMARY OF THE INVENTION

Embodiments of the invention provide a container that retains a plurality of objects and comprises a holder pad having a plurality of holders, wherein each holder has an opening to receive an object of the plurality of objects. Each holder of the plurality of holders further comprises a flexible leaflet, that surrounds the opening in the holder, wherein the flexible leaflet has an interference shape that also narrows in diameter as it approaches an arrester, the arrester, located below the flexible leaflet, holds a retained object of the plurality of objects in the holder. The flexible leaflet has two states: a first state that holds the retained object of the plurality of objects with sufficient firmness to retain the retained object of the plurality of objects in the holder and a second state in which the interference shape of the flexible leaflet interferes with an outer housing of the retained object of the plurality of objects in the holder to form a flexure that enables removal of the retained object of the plurality of objects from the holder pad.

Embodiments of the invention also provide a marker tip holder box that comprises a marker tip holder pad having a plurality of marker tip holders to retain marker tips for use with a pen-stylus. Each marker tip holder has an opening to receive a marker tip. Each marker tip holder further comprises a flexible marker tip leaflet, that surrounds the opening in the marker tip holder, wherein the flexible marker tip leaflet has an irregular but nearly conical shape that narrows in diameter as it approaches a marker tip arrester that is located below the flexible marker tip leaflet, such that a retained marker tip rests in the marker tip arrester in the marker tip holder. The flexible marker tip leaflet has two states, a first state that holds the marker tip with sufficient firmness to retain the marker tip in the marker tip holder, and a second state in which the irregular but nearly conical shape of the flexible marker tip leaflet interferes with an outer housing of a marker tip retained in the marker tip holder to form a flexure that enables removal of the retained marker tip from the marker tip holder box.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

Figure 1:
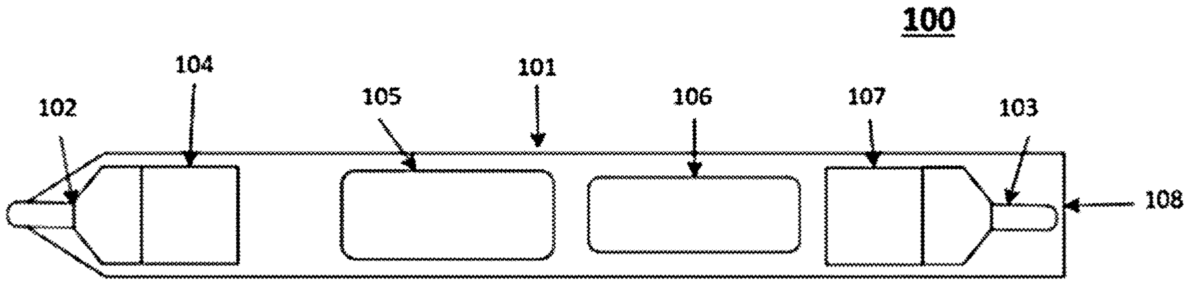
FIG. 1 illustrates an active pen-stylus 100 configured for communications with a tablet device, such as an e-paper tablet.

The figures depict various embodiments of the presented invention for purposes of illustration only. One skilled in the art will readily recognize from the following discussion that alternative embodiments of the structures and methods illustrated herein may be employed without departing from the principles described herein.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. An ordinarily skilled artisan will readily recognize from the following description that alternative embodiments of the structures and methods illustrated herein may be employed without departing from the principles described herein.

Overview

Disclosed is a system (and related process) for a marker tip holder box that holds replaceable marker tips suitable for use in an active pen-stylus. A description of this specific invention begins at FIG. 8, following a description of the replaceable marker tips that the marker tip holder box is intended to hold. Before describing the invention in detail, a description will be provided of the replaceable marker tip and the active pen-stylus that uses the replaceable marker tip. Following this description, embodiments of the marker tip holder box invention will be described.

As an ordinary artisan will recognize, the design principles employed herein for the replaceable marker tip holder box are applicable to containers for the storage and transportation of other types of goods. Thus, the ordinary artisan will further recognize that the replaceable marker tips serving as the retained objects here could easily be replaced by other types of retained objects in a container that embodies similar principles to the container disclosed herein. In short, the marker tip holder box disclosed herein comprises an embodiment of the invention.

Example: Active Pen-Stylus Having Replaceable Marker Tips

Embodiments of the invention provide a marker tip holder box that is designed to hold replaceable marker tips. For example, the replaceable marker tips may be intended to provide a good (paper-like) writing feeling for users of its corresponding pen-stylus when the pen-stylus engages with a tablet device, such as an e-paper tablet. The replaceable marker tips may also provide other functions, such as a high quality antenna function. An active pen-stylus is intended to operate with devices such as an e-paper tablet device that receives inputs from the active pen-stylus when the pen-stylus makes physical contact with a contact-sensitive surface (e.g., a touch-sensitive screen on the e-paper tablet device.

An active pen-stylus (or more commonly "active pen") is a pen-stylus input device that allows users to e.g., write, sketch or draw on the display of the computing device, e.g., the e-paper tablet. An active pen-stylus includes digital components and/or circuitry that communicate with the computing device, e.g., the e-paper tablet. This communication enables advanced features such as force (e.g., pressure) sensitivity, tilt detection, programmable buttons, palm detection, eraser tips, memorizing settings, and writing data transmission. Viewed more expansively, communications between the computing device and the active pen-stylus enables a wide mix of peripheral sensors to be placed in the active pen-stylus with the resulting data reported to the computing device, e.g., the e-paper tablet. Such sensors placed in the active pen-stylus may range from simple buttons to enhanced artificial intelligence features.

An active pen's electronic components typically include a power source that may enable the device's electronics to provide lower latency and greater fidelity than other pen types, e.g., a passive pen. Active pens provide a number of advantages over passive pens, including hover latency, e.g., an active pen may typically be activated by merely being in proximity to a display, e.g., the display associated with an e-paper tablet.

Once the active pen touches or contacts a display screen of a device like an e-paper tablet, electronics associated with the display screen generates a signal which the e-paper tablet device can process as a gesture made by the user. Upon detecting the gesture by the pen-stylus, electronics within the contact-sensitive screen generates a signal that encodes instructions for displaying content or updating content previously displayed on the screen of the e-paper tablet device based on the movement of the detected gesture across the screen.

In contrast with an active pen, a passive pen typically has no internal power source. A passive pen remains in an inactive state until the pen touches a device screen (e.g., a tablet device screen) causing a signal to pass from the device through the passive stylus and back to the device. The electronics associated with a passive pen may be integrated into the pen-stylus device or even provided in a small cartridge that is placed inside a pen-shaped stylus cover designed to better suit human ergonomics than the small cartridge containing the electronics and other components.

FIG. 1 illustrates an active pen-stylus 100 that comprises a core member 102 that itself comprises one or more antennas configured for communications with a tablet device, such as an e-paper tablet. The active pen-stylus 100 may include one or more force sensing systems 104 that detect force, e.g., the force imparted by the user pressing the tip of the pen-stylus 100 on a display of a tablet device. In addition, this element may also help emulate human interaction with conventional writing utensils like pencil and paper e.g., render "a pencil and paper feeling". The active pen-stylus 100 also includes a power source, e.g., a battery 106. Among other things, the battery 106 allows the active pen-stylus 100 to support a "hover" function that allows the active pen-stylus 100 to enter a sleep state for battery charge preservation when it is not actively engaged with the display of the e-paper tablet and to wake up from the sleep state when the core member 102 detects a proximity to the display of the e-paper tablet. The active pen-stylus 100 might not actually draw lines on the display of the e-paper tablet until a tip of the active pen-stylus 100 physically touches the display of the e-paper tablet.

An active pen 100 conventionally comprises a PCBA 105 which includes electronic components needed for driving the signal lines associated with the core member 102. The PCBA 105 could alternatively be provided as a flexible printed circuit (FPC). The PCBA 105 may include an appropriate active pen PCBA or IC/ASIC/MCU that processes data received from the core member 104 for sensing force or displacement with high resolution sensing of the force during the interaction between the active pen 100 and an object, e.g., the surface of the computing device (e.g., an e-paper tablet).

The active pen 100 receives user input data associated with drawing on a screen of the associated computing device (e.g., an e-paper tablet). The active pen 100 may also include an erasure system that receives user input data related to erasing portions of a display on the screen of the associated computing device, e.g., an e-paper tablet. In a sense, the erasure system operates identically as the active pen-stylus system, e.g., but where one draws, the other erases.

In operation, the force sensing system 104 receives physical forces imparted to a marker tip of the active pen 100 (e.g., the marker tip 303 shown in FIG. 3) when the marker tip engages with a display on a tablet device (e.g., an e-paper tablet) and translates the physical force received into an electronic signal that is transmitted to the PCBA 105 whose components may perform a variety of processes on the signals received. The PCBA 105 may then transmit the signals back to the tablet device (e.g., the e-paper tablet) for further action (e.g., drawing a line).

In embodiments where a secondary antenna system in the active pen 100 enables tail eraser functionality, the active pen 100 also comprises a second antenna system 103, which enables the active pen 100 to transmit and receive signals with the computing device (e.g., the paper tablet) through the tail eraser portion of the active pen 100 near a cap 108. In this embodiment, the active pen 100 also includes a second pressure sensing system 107 that controls the pressure imparted to the display of the computing device from the erasure activity. Likewise, the PCBA 105 may include an appropriate active pen PCBA or IC/ASIC/MCU that processes data associated with erasure functionality received from the second antenna system 103.

The active pen 100 also typically includes an external casing 101 as a pen-stylus holder, typically formed in a cylindrical shape and made of non-metal material such as a plastic that contains the internal electronics within the casing 101. The top end of the casing 101 may be provided with the cap 108.

Figure 2:
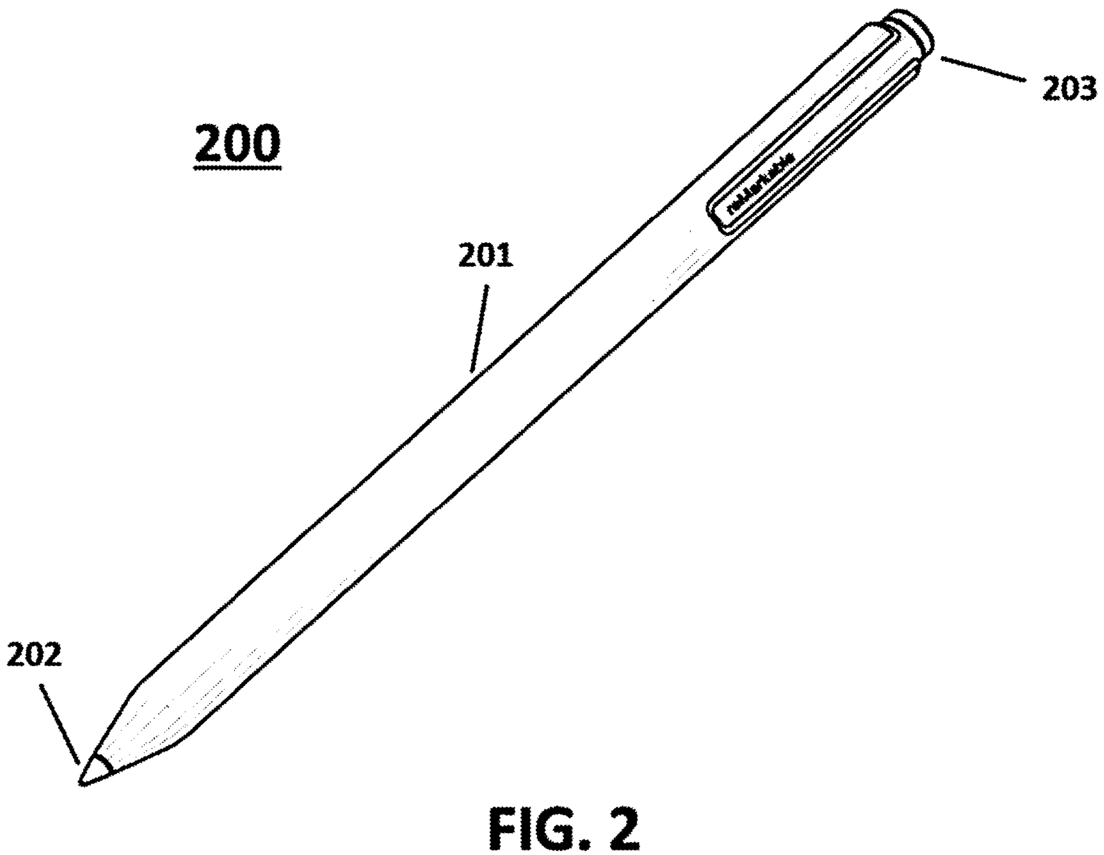
FIG. 2 illustrates an external casing 201 for a pen-stylus 200 designed to fit a user's hand, according to an embodiment of the invention.

FIG. 2 illustrates an external casing 201 for a pen-stylus 200 designed to fit a user's hand, according to an embodiment of the invention. The pen-stylus 200 includes a marker tip 202 and an eraser 203. The marker tip 202 operates as a part of the core member 102 shown in FIG. 1, and the eraser 203 operates as part of the second antenna system 103 shown in FIG. 1. As discussed below, the marker tip 202 may comprise a replaceable part, e.g., a replaceable marker tip.

Figure 3:
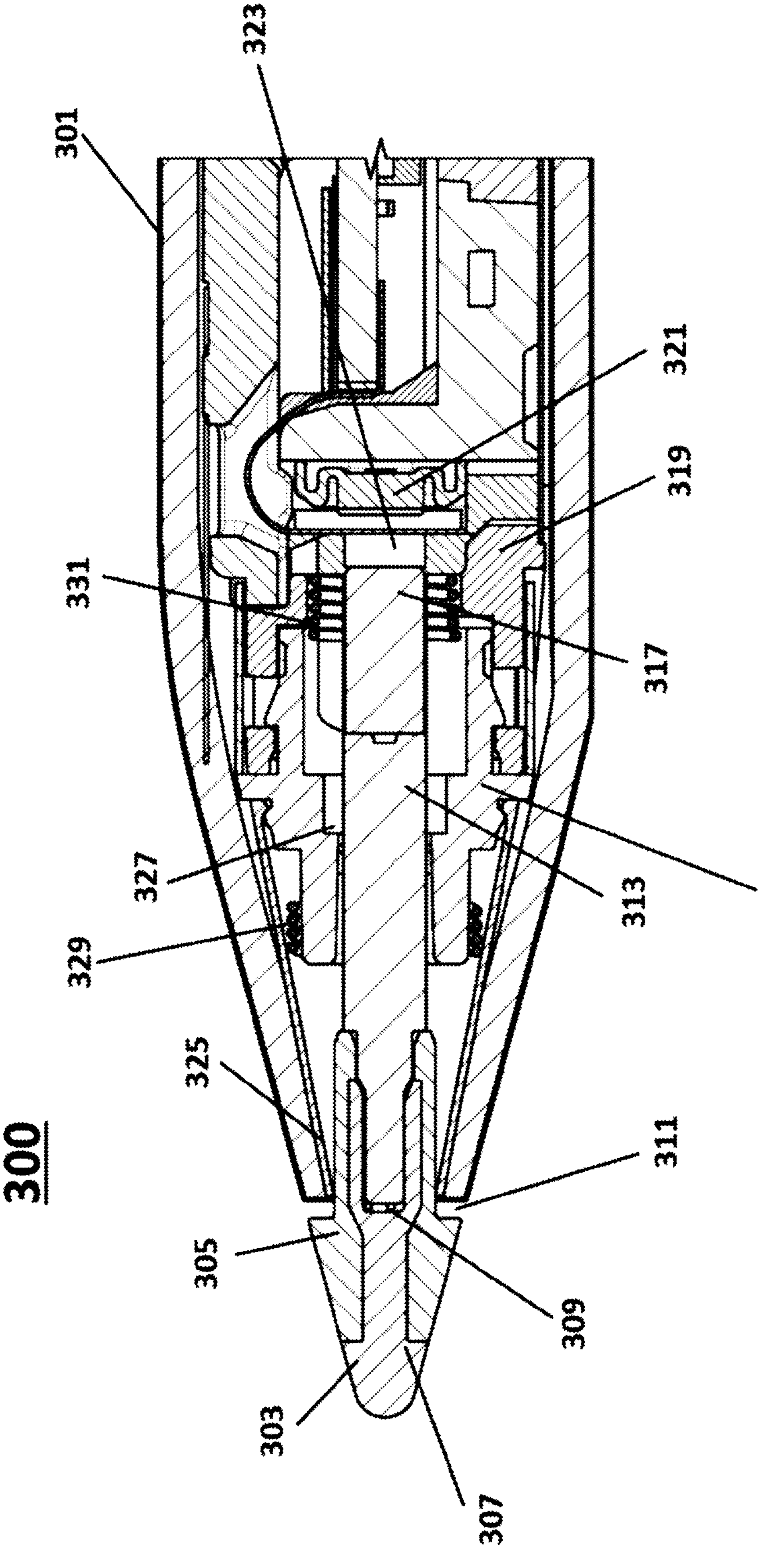
FIG. 3 illustrates a cross section of the forward portion of an active pen-stylus 300 that a user may employ for tasks such as drawing a line on the display of a device (e.g., an e-paper tablet), according to an embodiment of the invention.

FIG. 3 illustrates a cross section of the forward portion of an active pen-stylus 300 that a user may employ for tasks such as drawing a line on the display of a device (e.g., an e-paper tablet), according to an embodiment of the invention. The active pen-stylus 300 includes a core (e.g., the core member 102 shown in FIG. 1) comprised of components such as a first antenna 307 and a second antenna 325. The active pen-stylus 300 also includes a force sensor (e.g., the force sensing system 104 shown in FIG. 1) comprised of components such as a writing shaft 313, a first spring coil 331, a second spring coil 329, and a force sensor 323.

The active pen-stylus 300 provides high accuracy for various drawing tasks due to interactions between the first antenna 307 and the second antenna 325, in part because of the placement of the first antenna 307 and the second antenna 325 with respect to each other and with respect to the active pen-stylus 300 itself. As shown in FIG. 3, the second antenna 325 surrounds the first antenna 307, but the second antenna 325 and the first antenna 307 do not overlap horizontally in the active pen-stylus 300 and are further separated from each other by the insulator 305.

The active pen-stylus 300 also offers advanced force (e.g., pressure) sensing, e.g., a low activation force, high maximum force, and a high dynamic range. To translate the detecting force imparted by the pen-stylus 300 against the display of the e-paper tablet, the writing shaft 313 is designed to move towards and/or away from a force sensor 323, which registers activity between a replaceable marker tip 303 and the display (e.g., the display of the e-paper tablet), including the pressure applied by the user of the pen-stylus 300 to the display. Among other things, a bottom bracket 319 prevents the writing shaft 313 from rotating about its center axis. As previously discussed, the writing shaft 313 is designed to move towards and/or away from a force sensor 323, which registers activity between the replaceable marker tip 303 and the display (e.g., the display of the e-paper tablet), including the force (e.g., pressure) applied by the user of the pen-stylus 300 to the display. The active pen-stylus 300 has been designed to have a minimum set of components, according to an embodiment of the invention. Further details about structures and functions of active pen-stylus writing systems can be found in U.S. application Ser. No. 18/779,164, filed on Jul. 22, 2024 entitled "Marker Writing System" and given reference number "21149403," which is incorporated by reference herein.

The Replaceable Marker Tip

In the pen-stylus 300, the first antenna 307 forms a portion of a removable marker tip 303 that also includes an insulator 305. The marker tip 303 removably attaches to the writing shaft 313 via a series of crush ribs 309 located in an interior cavity on the marker tip 303, according to an embodiment of the invention. Further details about structures and functions of replaceable marker tips can be found in U.S. application Ser. No. 18/779,151, filed on Jul. 22, 2024 entitled "Replaceable Conductive Marker Tip," and given reference number "21149400," which is incorporated by reference herein.

Figure 4:
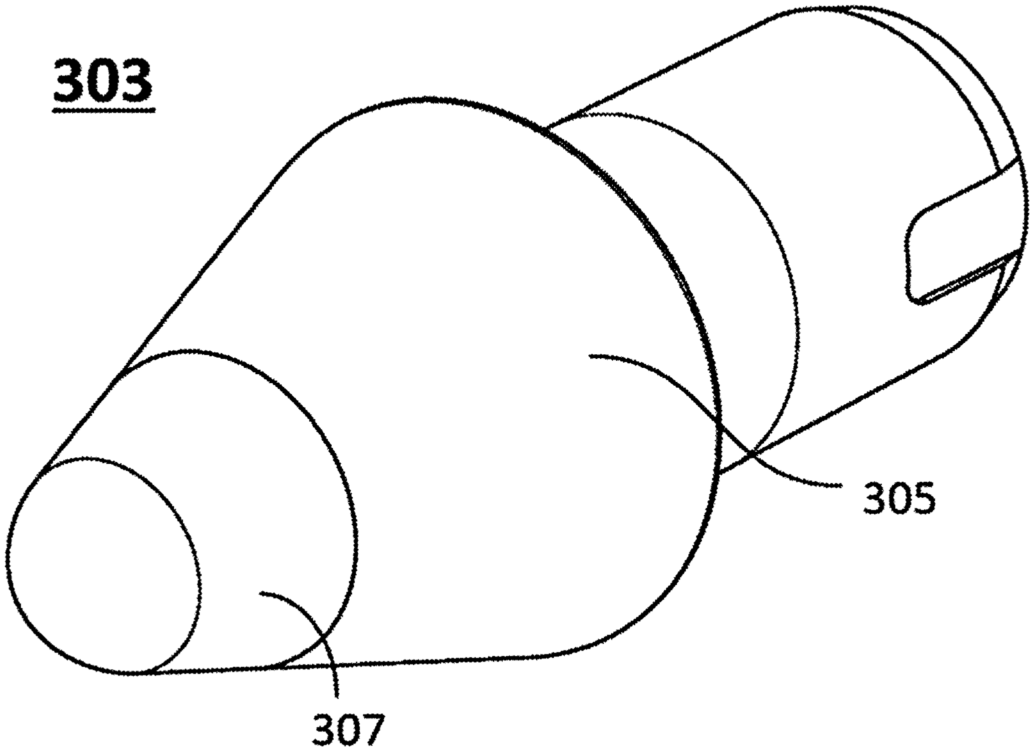
FIG. 4 illustrates a replaceable marker tip 303 for the pen-stylus 300 that provides a good writing feeling for users of the pen-stylus 300 while also providing a high quality antenna function, specifically serving as the main antenna for the pen-stylus 300, according to an embodiment of the invention.

FIG. 4 illustrates a replaceable marker tip 303 for the pen-stylus 300 that provides a good writing feeling (e.g., paper emulation) for users of the pen-stylus 300 while also providing a high quality antenna function, specifically serving as the main antenna for the pen-stylus 300, according to an embodiment of the invention. The marker tip 303 creates a high-quality writing feeling (e.g., paper emulation) by providing a consumable element in the interface between the pen-stylus 300 and a device such as an e-paper tablet. Many of the marker tips in the prior art are based on conventional technology. In contrast, the marker tip 303 has been customized for operation with devices such as e-paper tablets that aim to replicate the feel of paper, enabled in part, by allowing the marker tip 303 to be consumed slowly during use.

While possibly more frequent in passive than active pens, only a few marker tips have previously been designed as consumable parts. However, since the main objective of e-paper tablets is to emulate paper, specifically the feel of paper texture, special care must be undertaken to achieve this goal. The emulation of a paper feeling often requires that some component (e.g., the tip of the pen-stylus 300) should be amenable to wear (e.g., consumption) as a tradeoff for attaining the feel of paper for users. When such a tradeoff is in play, then it is generally easier and cheaper to replace a component like a marker tip than another component like a display surface. Of course, it might be possible to construct a marker tip of novel materials that aids in emulating paper but does not wear; however, such materials are not readily available on the market at present.

Figure 5:
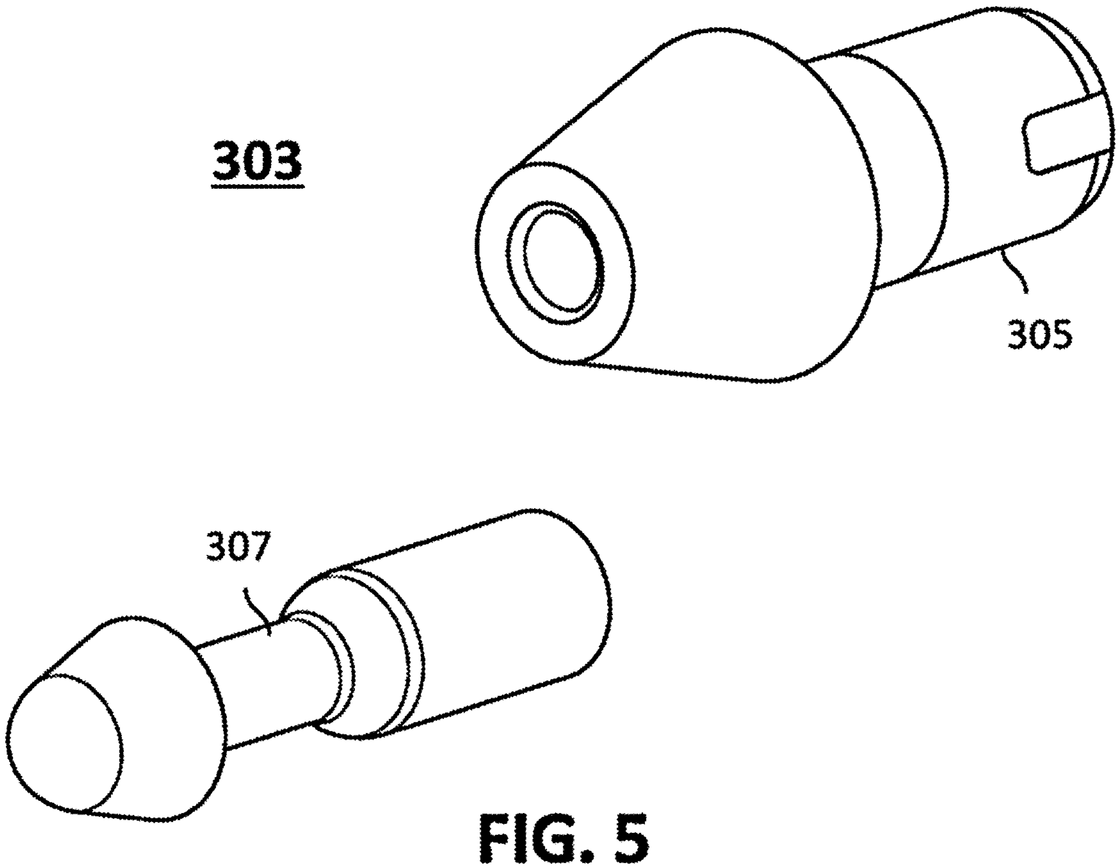
FIG. 5 illustrates a marker tip 303 comprising a core antenna 307 and an insulating material 305, according to an embodiment of the invention.

As shown in FIG. 5, the marker tip 303 comprises a core antenna 307 and an insulating material 305, according to an embodiment of the invention. The core antenna 307 serves both as an antenna for the pen-stylus 300 and has a specific and defined geometric shape that has been designed to provide good signaling properties and which also provides a tactile feeling during operation that emulates a paper writing feeling for users, especially in combination with a specialized texture on the display of an e-paper tablet.

The marker tip 303 has been designed to be able to push onto the pen-stylus 300, specifically the writing shaft 313 without requiring specialized tools. The ease of replacing the marker tip 303 on the pen-stylus 300 arises from its nature as a replaceable part, as mentioned above. The marker tip 303 is held on by force to the writing shaft 313. The marker tip 303 has also been designed not to rotate on the writing shaft 313. Among other things, if the marker tip 303 rotated, then the signal between the pen-stylus 300 and the display of the e-paper tablet would cause instability.

Figure 6:
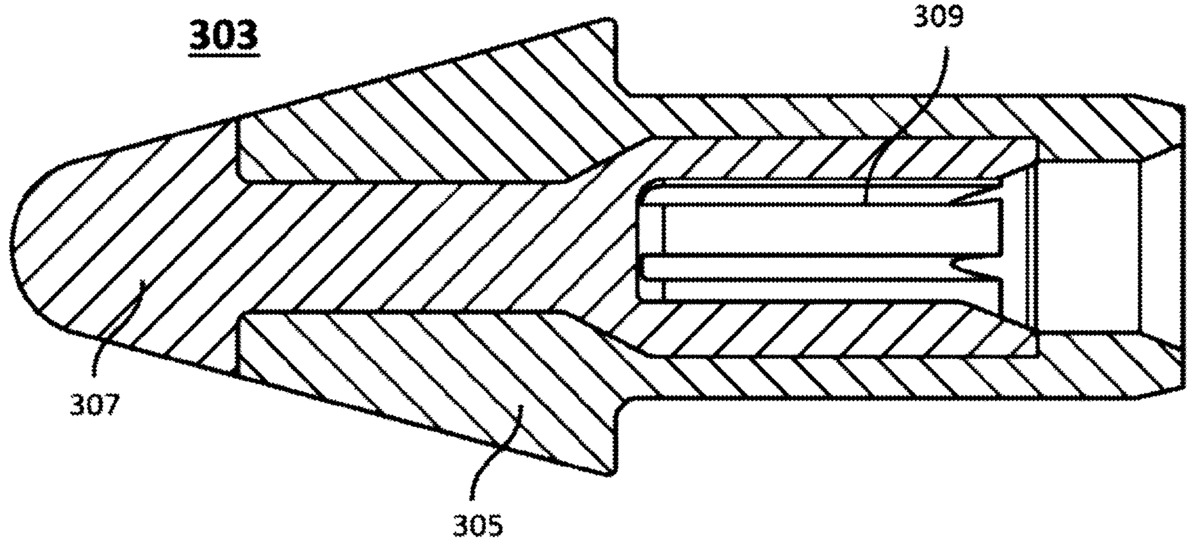
FIGS. 6-7 illustrate crush ribs 309 that hold the core antenna 307 onto the writing shaft 313, according to an embodiment of the invention.
Figure 7:
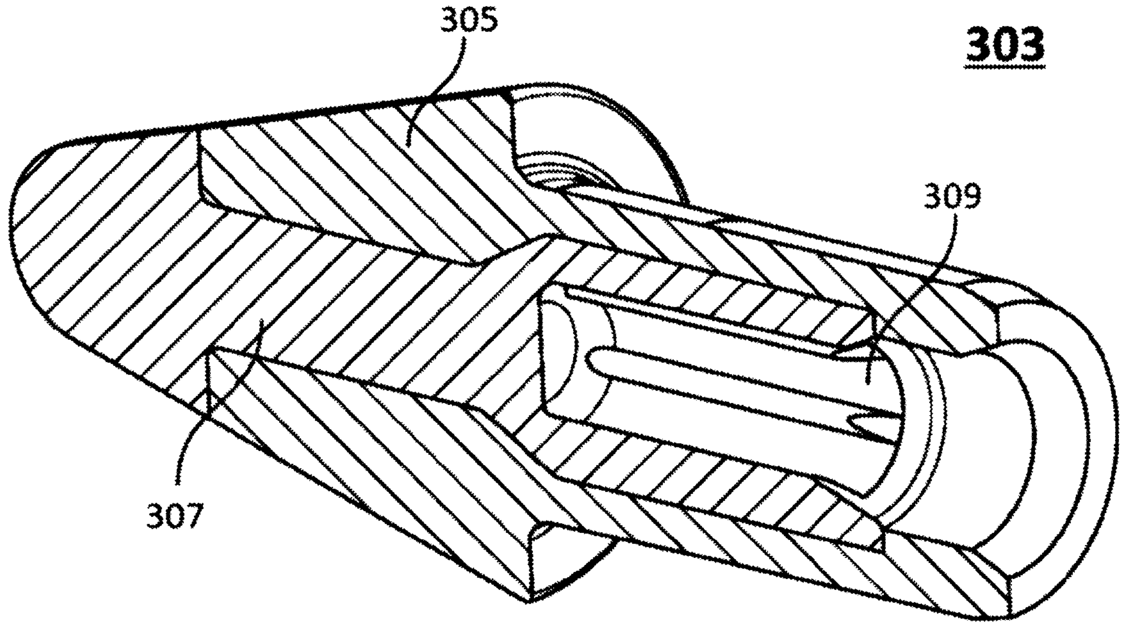

As shown in FIGS. 6-7, crush ribs 309 are critical for holding the core antenna 307 onto the writing shaft 313. The marker tip 303 connects to the pen-stylus 300, specifically, the writing shaft 313 by employing the crush ribs 309 in the core antenna 307 that presses the core antenna 307 around and on the inside of the writing shaft 313 rather than on the outside of the writing shaft 313. Thus, the marker tip 303 can be said to go onto the writing shaft 313 rather than into it, according to an embodiment of the invention. In an alternative embodiment of the invention, the marker tip 303 could be designed to go into the writing shaft 313, which as discussed above is the main vessel for transferring forces to the force sensor 323.

As mentioned, the material composition of the marker tip 303 will wear (e.g., be slowly consumed) and will need to be replaced from time to time, according to an embodiment of the invention. More specifically, the core antenna 307, as well as the insulating material 305, will wear and will need to be replaced. The operation lifetime for a given core antenna 307 depends on user behavior and user preference. The core antenna 307 might last longer than six months for some users, while it might last just one month for other users.

As mentioned, the lifetime for the marker tip 303 depends on a variety of factors related to its use, such as the force applied while using the pen-stylus 300, how much and how often the user tilts the pen-stylus 300, and how often the user rotates the pen-stylus 300, along with the user's own personal sensitivity. Put another way, some users may find the marker tip 303 to be perfectly fine when it is nearly worn down to the marker tip clearance 311—even at that point, some portion of the core antenna 307 still remains—conversely, other users may find the fidelity of the marker tip 303 not suiting their needs even before the wear on the marker tip 303 has abraded the core antenna 307 down to the beginning of the insulating material 305.

As mentioned, the removable marker tip 303 should be removable by hand and require no specialized tool for its removal, according to an embodiment of the invention. Conversely, the marker tip 303 should not slip or fall out of the pen-stylus 300. Likewise, the marker tip 303 should not spin and/or cause wear for other parts of the pen-stylus 300.

Depending on the specific design and materials employed, the force needed to remove the marker tip 303 applied by a user (e.g., by hand and without a tool) may be set in a range between 2 Newtons to just below 8 Newtons, according to an embodiment of the invention. Experimentation has shown that the marker tip 303 should be at least 2 Newtons to prevent the marker tip 303 from being able to spin on its axis. The preference is 2 Newtons but could be nearly 8 Newtons, according to an embodiment of the invention.

Finally, a pen-stylus 1400 safety feature involves the removable marker tip 303, according to an embodiment of the invention. Specifically, a positive stop 327 shown in FIG. 3 prevents the writing shaft 313 from being removed from the pen-stylus 300. The positive stop 327 may be included in a writing shaft captivator 315. As discussed, the removable marker tip 303 is designed to be removed by the user by hand and without the need for a tool. During this replacement process, the writing shaft 313 may possibly experience some forces that might otherwise disrupt its location without the presence of the positive stop 327; put another way, when the force applied by a user in replacing the marker tip 303 exceeds the 2N to 8N range specified above, then the marker tip 303 comes off the pen-stylus 300.

The marker tip 303 may be inexpensive to manufacture and is designed to be interchangeable with replacement marker tips, according to an embodiment of the invention. While inexpensive, as a customized device, the marker tip 303 requires care in its manufacture and storage. Accordingly, the marker tip 303 may be difficult to manufacture if caution is not practiced.

As shown by comparing FIGS. 4-7, the marker tip 303 comprises an overmolded design, according to an embodiment of the invention. The core antenna 307 is overmolded with the insulating material 305 to create a more appealing visual geometry and to function as an insulator for the constraining component (e.g., the writing system portion of the pen-stylus 300).

The inscribed diameter of the marker tip 303 provides 20 microns of tolerance, according to an embodiment of the invention. Otherwise, the inscribed diameter across the crush ribs 309 of the marker tip 303 might be too loose or too tight on the outer diameter of the writing shaft 313. The volume of material in the crush ribs 309 dictates the pull off force, and achieving a good force range may be attained by having tight manufacturing tolerances, according to an embodiment of the invention.

An Embodiment of the Container—a Marker Tip Holder Box

As mentioned above, an ordinary artisan will recognize that the replaceable marker tips 303 enclosed in a marker tip holder box (e.g., the marker tip holder box 800 shown in FIG. 8) are essentially objects held in a container. This container has been designed to hold these retained objects in a manner that aims to satisfy the following conditions—in particular, the container:

- Protects the retained object (e.g., the replaceable marker tips) during shipping,
- Constrains the retained object in a specific orientation (e.g., the replaceable marker tips are held tip-end down to facilitate replacement), and
- Facilitates easy removal of the object (e.g., the replaceable marker tip).

Embodiments of such a container specifically employed to hold replaceable marker tips will now be described.

As described above, the marker tip 303 will degrade over time and need to be replaced. Accordingly, the user of the pen-stylus 300 will likely benefit from having at least a small supply of new marker tips 303 readily available. As described, the marker tips 303 are relatively small pieces, often dark in color and possibly somewhat hard to see on their own, and the opening for the marker tip's crush ribs 309 attachment point to the pen-stylus is quite small in many embodiments. As such, it will likely be helpful for many users to keep their replacement marker tips 303 in a safe and convenient location.

Figure 8:
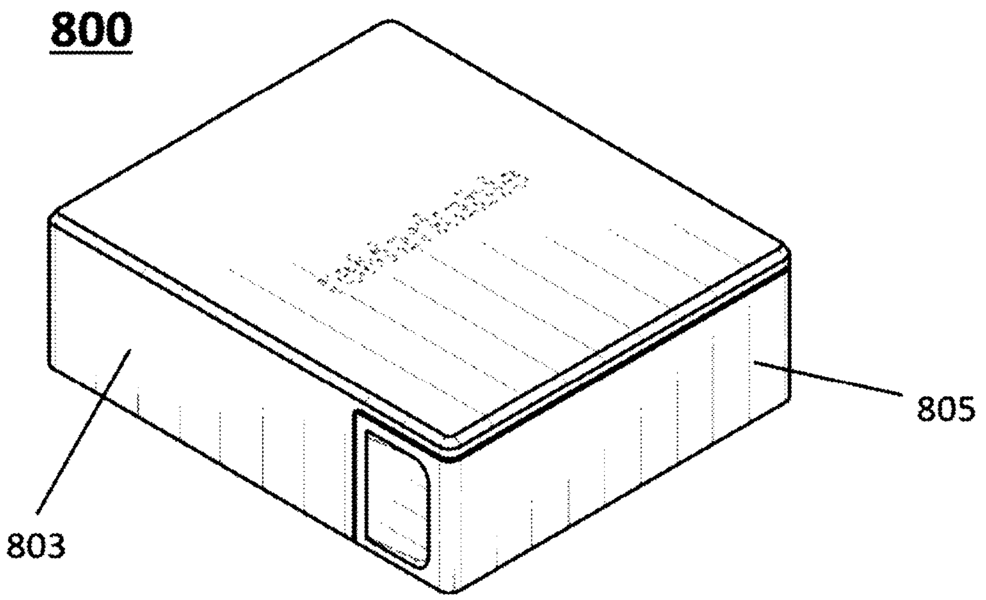
FIG. 8 illustrates a container, a marker tip holder box 800, built to hold replaceable marker tips, such as the marker tip 303, according to an embodiment of the invention. The marker tip holder box 800 includes a holder portion 803 and a drawer portion 805.

FIG. 8 illustrates a container, a marker tip holder box 800, built to hold replaceable marker tips, such as the marker tip 303, according to an embodiment of the invention. The marker tip holder box 800 includes a protective cover 803 and a drawer portion 805 that is configured to hold the replacement marker tips.

The marker tip holder box 800 may be constructed of many materials, but a hard durable plastic material is likely sufficient. The marker tip holder box 800 does not need to be made waterproof but it should be configured to avoid dust and other contaminants that may interfere with the ease with which the drawer portion 805 slides open.

As discussed above, the user of the pen-stylus 300 is unlikely to need many replacement marker tips in a short period of time and possibly even in an extended time period. Accordingly, the marker tip holder box does not need to be large. For example, a 38.5 mm by 45 mm. box is likely sufficient since this offers enough space for holding at least six replaceable marker tips for a hand-held pen-stylus 300. Another consideration is the idea that the marker tip holder box 800 should be sufficiently small that the user of the pen-stylus 300 is not likely to lose or misplace the marker tip holder box 800 and that the marker tip holder box 800 may be at just the right size for carrying the number of replaceable marker tips that the user is likely to need over some extended period of time, according to an embodiment of the invention.

Of course, these considerations are based on the assumptions that the replaceable marker tips will not need to be replaced too often and that the relative size of the replaceable marker tip is comparable to the pen-stylus 300 being roughly the size of a conventional pencil or fountain pen. If, for example, the replaceable marker tips require even more frequent replacement and/or the pen-stylus 300 has larger dimensions than a conventional pencil, then the marker tip holder box 800 could be made another size, e.g., larger.

If the use case for the object container comprises objects that need to be replaced more frequently or less frequently than the replaceable marker tips here, or if different size considerations are involved for the retained object(s), then the container may have a different size and may retain a different number of objects, according to an embodiment of the invention.

Figure 9:
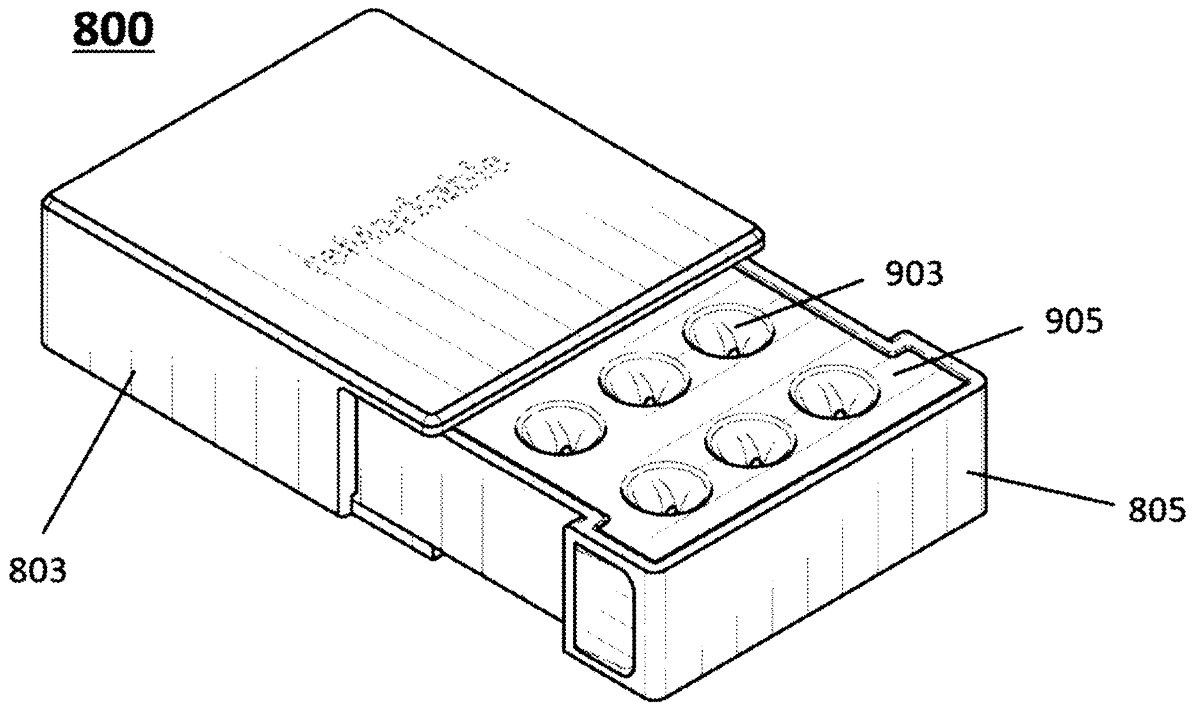
FIG. 9 illustrates the marker tip holder box 800 with its drawer 805 open to reveal holders 903 for replaceable marker tips, according to an embodiment of the invention.

FIG. 9 illustrates the marker tip holder box 800 with its drawer 805 open to reveal a marker tip holder pad 905 having multiple marker tip holders 903 for holding replaceable marker tips, according to an embodiment of the invention. As shown in FIG. 9, the marker tip holder box 800 includes space for holding six replaceable marker tips.

As discussed above, constructing the marker tip holder box 800 to hold six replaceable marker tips is a design decision based on factors such as the assumed average useable lifetime of a replaceable marker tip and the size of the replaceable marker tip for the pen-stylus 300, combined with the idea that the marker tip holder box 800 should be a practical size for the users. Changes in these assumptions may warrant reconsideration of the size of the marker tip holder box 800, according to various embodiments of the invention. Likewise, if the container is intended to retain another type of object, then fewer or more objects may be optimally retained. In other words, the number of objects retained is a design consideration based on a specific use case and the characteristics of the object retained.

The material composition of the marker tip holder pad 905 may comprise a number of materials. A flexible plastic material may work well for at least some embodiments of the invention. The overall goal for the marker tip holder pad 905 is to hold (e.g., fully constrain) the replaceable marker tips straight in the marker tip holders 903 with the marker tip down towards the bottom of the marker tip holder 903 and the marker tip's crush ribs 309 towards the opening of the marker tip holder 903 and to simplify the replacement or insertion process for users when replacing the replaceable marker tips on their pen-stylus 300. Accordingly, a flexible plastic material may be well suited for this purpose as discussed below, according to an embodiment of the invention.

The discussion above regarding removal of the marker tip 303 from the pen-stylus 300 also applies to placing a new marker tip on the pen-stylus 300. The user should preferably not require any specialized tools as the user adds a new marker tip 303 to the writing shaft 313. As mentioned, the marker tip 303 will employ the crush ribs 309 to hold the new marker tip 303 to the writing shaft 313.

To add a new marker tip 303 to the pen-stylus 300 using the marker tip holder box 800, the user may simply insert the writing shaft 313 into one of the marker tip holders 903 on the marker tip holder pad 905. The marker tip holders 903 are designed to hold a marker tip down towards the bottom of the marker tip holder 903 and the marker tip's crush ribs 309 towards the opening of the marker tip holder 903. The upright position of the marker tip 303 simplifies the process of engaging the writing shaft 313 onto the crush ribs 309 of the marker tip 303 and then extracting the now replaced marker tip 303 from its respective marker tip holder 903, according to an embodiment of the invention.

In terms of containers designed to retain objects other than replaceable marker tips, the container design should consider how the retained object is employed with respect to other objects with which the retained object interacts. Here, the replaceable marker tip 303 contains crush ribs 309 in a rear portion that have been designed to fit onto a writing shaft 313 of a pen-stylus 300. Consequently, the retained object here (the marker tip 303) is retained upright in a downward orientation so that its connector (e.g., the crush ribs 309) faces the part (e.g., the writing shaft 313) to which it connects. If the retained object connected to another object from its front portion, for example, then possibly the retained object could be held upright but with its front position towards the top rather than towards the bottom. Likewise, if the retained object connected to another object from a side position, for example, then possibly the retained object should be retained in something other than an upright position. Thus, the retained object should preferably be held in an orientation that will facilitate its easy removal and use, according to an embodiment of the invention.

Each marker tip holder 903 is designed to hold just one replaceable marker tip, according to an embodiment of the invention. An ordinary artisan will recognize that it would be possible design the marker tip holder 903 to stack the replaceable marker tips such that that more than one replaceable marker tip was found in each marker tip holder 903, although this might not be an optimal solution for all use cases and is not the embodiment shown in FIG. 9.

Thus, a container should preferably retain its objects in a manner that protects them during transportation and in an orientation that facilitates their removal. Given the universe of objects that might be retained in a container, a designer may find it appropriate to retain more than one object in an individual holder within the container, according to an embodiment of the invention.

Figure 10:
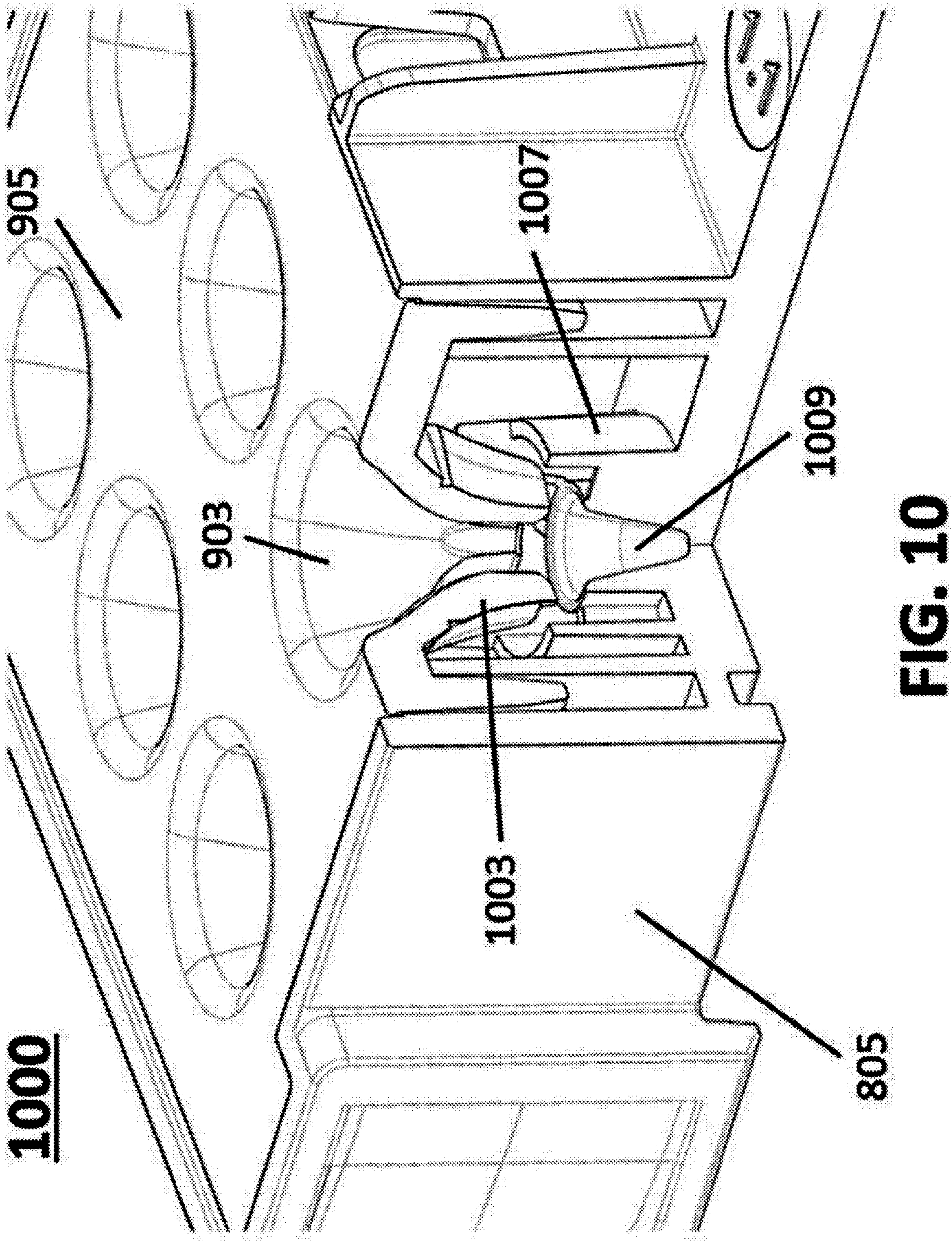
FIG. 10 is a cutaway view of a marker tip holder 903 in the marker tip holder pad 905 of the drawer 805 in the marker tip holder box 800 shown in FIG. 8, according to an embodiment of the invention.

FIG. 10 illustrates a cutaway view of a marker tip holder 903 in the marker tip holder pad 905 of the drawer 805 in the marker tip holder box 800, according to an embodiment of the invention. The marker tip holder 903 comprises a number of components, primarily a flexible marker tip leaflet 1003 and a marker tip arrester 1009. The approximately conical-shaped marker tip leaflet 1003 circles around the opening of the marker tip holder 903 and narrows in diameter as it reaches the marker tip arrestor 1009. The marker tip leaflet 1003 is disclosed as having a nearly conical shape; however, the near conical shape of the marker tip leaflet is not critical-what is critical is that the marker tip leaflet 1003 have a shape that enables interference with an outer housing of the retained object, which here is a replaceable marker tip 303 having a specific shape that works with a nearly conical leaflet 1003 to form a flexure when needed. Thus, the marker tip leaflet 1003 has an interference shape, a shape that enables interference with the retained object to enable the formation of a flexure, as described below. Thus, the marker tip leaflet 1003 here has an approximately conical shape because this particular shape enables the appropriate interference with the retained object, and the marker tip leaflet 1003 may interfere with the outer housing of the marker tip 303 causing a flexure that facilitates and enables removal of the marker tip 303 from the marker tip holder box 800. Among other things, the marker tip leaflet 1003 enables the marker tip holder box 800 to not rattle its marker tips when shaken.

The marker tip leaflet 1003 enables a replaceable marker tip to be held in place in the marker tip arrestor 1009 until the user inserts an appropriate tool (e.g., the front end of the writing shaft 313) to extract the replaceable marker tip. The marker tip leaflet 1003 in the marker tip holder 903 has been designed to hold the marker tip with sufficient firmness such that a replaceable marker tip held in the marker tip arrester 1009 will not fall out of the marker tip arrestor 1009 if the user happens to turn the marker tip holder box 800 upside down when the drawer 805 is in an open position. Similarly, the marker tip leaflet 1003 avoids clearances and removes rattling issues involving the replaceable marker tips that it holds.

To further simplify installing a replaceable marker tip 303 on the pen-stylus, the marker tip arrestor 1009 holds its replaceable marker tip 303 upright in the marker tip holder pad 905. Holding the replaceable marker tip upright in the marker tip arrestor 1009 facilitates ease of removal by a tool such as the front end of the writing shaft 313 to insert into the crush ribs 309 on the replacement marker tip 303, according to an embodiment of the invention.

The marker tip leaflet 1003 may serve several functions within the marker tip holder box 800. The marker tip leaflet 1003 acts as flexure having two states. In a first state, the marker tip leaflet 1003 holds the marker tip 303 firmly when stationary. In a second state, the maker tip leaflet 1003 interferes with the outer housing of the marker tip 303 and enables the release of the marker tip 303 just after the marker tip 303 has started to engage with the writing shaft 313. This interference also provides sufficient clearance to enable the marker tip 303 to avoid hitting the marker tip leaflets 303 when extracting the marker tip 303 from the marker tip holder box 800.

In terms of other container embodiments, a leaflet similar to the marker tip leaflet 800 should have an appropriate shape that circles around an opening of the holder for retained objects and narrows in diameter as it reaches an object arrestor. Such container leaflets may comprise a variety of shapes but the selected shape for the container leaflet (the leaflet interference shape) should enable interference with the outer housing of the retained object causing a flexure that facilitates and enables removal of the retained object from the container, according to an embodiment of the invention. Thus, leaflets may serve several functions within the container. The leaflet acts as flexure having two states. In a first state, the leaflet holds the retained object firmly when stationary. In a second state, the leaflet interferes with the outer housing of the retained object and enables the release of the retained object just after the retained object has started to engage with whatever device it attaches to for removal. This interference also provides sufficient clearance to enable the retained object to avoid hitting the leaflets when extracting the retained object from the container. In addition, the leaflet enables the container to not rattle its retained object when shaken, e.g., during transportation.

The marker tip holder pad 905 also includes a marker stop wall 1007 that prevents the flexible marker tip leaflet 1003 from extending too far outward when a replaceable marker tip is being inserted into the marker tip holder pad 905 or being extracted from the marker tip holder pad 905, according to an embodiment of the invention. The marker stop wall 1007 circles around the marker tip leaflet 1003.

Other embodiments of the container may likewise include a stop wall of some form to prevent leaflets from extend too far outward, according to an embodiment of the invention.

Figure 11:
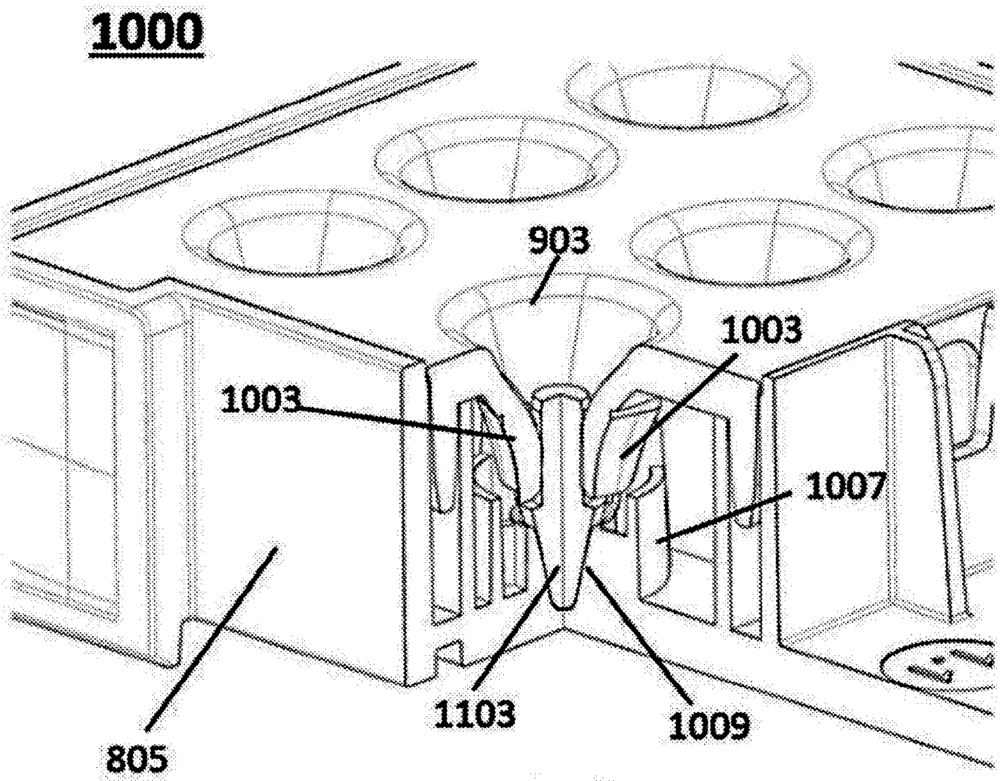
FIG. 11 provides a cutaway view of a marker tip arrestor 1009 holding a replaceable marker tip 1103 in the marker tip holder 903, according to an embodiment of the invention.

FIG. 11 provides a cutaway view of a marker tip arrestor 1009 holding a replaceable marker tip 1103 in the marker tip holder 903, according to an embodiment of the invention. The marker tip 1103 is also shown in a cutaway view in FIG. 11. As previously discussed, the marker tip holder 903 intends to hold the replaceable marker tip 1103 upright so that it may be more easily removed by an appropriate tool (e.g., the writing shaft 313) when the user of the pen-stylus 300 needs a new marker tip, according to an embodiment of the invention.

Figure 12:
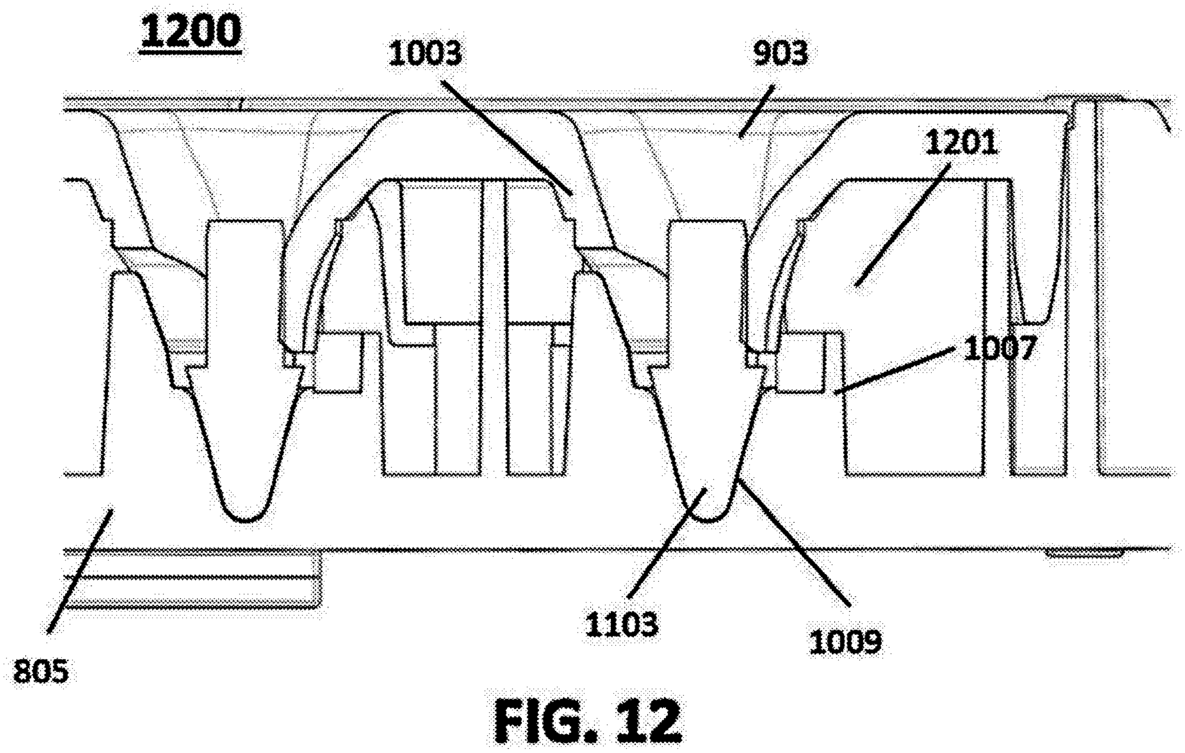
FIG. 12 illustrates a side view cutaway of the marker tip holder 903 showing the replaceable market tip 1103, according to an embodiment of the invention.

FIG. 12 illustrates a side view cutaway of the marker tip holder 903 showing the replaceable market tip 1103, according to an embodiment of the invention. The marker stop wall 1007 can be shown next to a material gap 1201. While the marker tip leaflet 1003 should not flex too far (hence, the marker stop wall 1007), the marker tip leaflet 1003 needs to flex with the application of just a reasonable amount of force, otherwise, the user will have to use an excessive amount of force to insert the marker tip 1103 in the marker tip arrestor 1009.

ADDITIONAL CONSIDERATIONS

As discussed, these pen-styluses can be equipped with a tail eraser allowing the user to erase content from the display of the computing device, e.g., the e-paper tablet. An active pen includes electronics components which enables the active pen to send and receive signals from the computing device. Such configurations provide additional precision and options for users as they go about erasing portions of drawings on an e-paper tablet. This should improve the efficiency of users interacting with e-paper tablets while also enabling them with more precise functional capabilities.

It is to be understood that the figures and descriptions of the present disclosure have been simplified to illustrate elements that are relevant for a clear understanding of the present disclosure, while eliminating, for the purpose of clarity, many other elements found in a typical system. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Some portions of above description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as engines, without loss of generality. The described operations and their associated engines may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise. While particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The invention claimed is:

1. A marker tip holder box system, comprising:

a plurality of marker tips;

a marker tip holder box that holds marker tips for a pen-stylus, comprising:

a marker tip holder pad having a plurality of marker tip holders, wherein each marker tip holder of the plurality of marker tip holders has an opening configured to receive a marker tip, each marker tip holder of the plurality of marker tip holders further comprising:

a flexible marker tip leaflet that surrounds the opening in the marker tip holder, wherein the flexible marker tip leaflet has an irregular but nearly conical shape that narrows in diameter as it approaches a marker tip arrester; and a marker tip arrester, located below the flexible marker tip leaflet, in which a retained marker tip is held against the arrester, wherein the flexible marker tip leaflet holds the retained object in two states, a first state that holds a marker tip with sufficient firmness to retain the marker tip in the marker tip holder and in the arrester, and a second state in which the irregular but nearly conical shape of the flexible marker tip leaflet interferes with an outer housing of a marker tip retained in the marker tip holder to form a flexure that enables removal of the retained marker tip from the marker tip holder box.

2. The marker tip holder box system of claim 1 wherein the retained marker tip resides in an upright position, wherein the retained marker tip has a forward end and rear end having a cavity, wherein the retained marker tip is configured to reside in the upright position in the marker tip arrestor wherein being held in the upright position places the rear end of the retained marker tip closer to the opening in the marker tip holder than the forward end.

3. The marker tip holder box system of claim 2 wherein the cavity on the retained marker tip is configured to attach to an external tool wherein the flexible leaflet reception of the external tool is configured to engage the second state of the flexible marker tip leaflet that forms the flexure that enables removal of the retained marker tip from the marker tip holder box.

4. The marker tip holder box system of claim 3 wherein the cavity on the retained marker tip includes crush ribs that are configured to attach to the external tool.

5. The marker tip holder box system of claim 1 wherein each marker tip holder of the plurality of marker tip holders further comprises a marker stop wall that prevents the flexible marker tip leaflet from further outward extension when a flexure is formed in the flexible marker tip leaflet.

6. The maker tip holder box system of claim 1 wherein the flexible marker tip leaflet is comprised of a flexible plastic material.

7. The marker tip holder box system of claim 1 wherein the marker tip holder box comprises six marker tip holders.

8. The marker tip holder box system of claim 1 wherein each marker tip holder of the plurality of marker tip holders holds only one marker tip.

9. The marker tip holder box system of claim 1, further comprising:

a drawer, wherein the marker tip holder pad resides in the drawer of the marker tip holder box.

10. The marker tip holder box system of claim 9 wherein the drawer seals sufficiently tightly to prevent dust from entering the marker tip holder pad when the drawer is closed.

11. The marker tip holder box system of claim 9, further comprising:

a protective cover into which the drawer fits.

* * * * *